United States Patent [19]

Aklufi

[11] Patent Number: 5,602,403

[45] Date of Patent: Feb. 11, 1997

[54] ION IMPLANTATION BURIED GATE INSULATOR FIELD EFFECT TRANSISTOR

[75] Inventor: Monti E. Aklufi, San Diego, Calif.

[73] Assignee: The United States of America as represented by the Secretary of the Navy, Washington, D.C.

[21] Appl. No.: 662,696

[22] Filed: Mar. 1, 1991

[51] Int. Cl.⁶ .............................................. H01L 31/0312
[52] U.S. Cl. .......................... 257/77; 257/289; 257/352; 257/410
[58] Field of Search ............................. 357/23.4, 4, 23.4, 357/23.15; 257/20, 24, 27, 57, 60, 66, 67, 69, 70, 75, 76, 77, 78, 187, 189, 192, 256, 260, 261, 262, 279, 289, 347, 352, 507, 403, 413, 410

[56] References Cited

U.S. PATENT DOCUMENTS

| | | | |
|---|---|---|---|
| 3,622,382 | 11/1971 | Brack et al. | 117/201 |
| 3,666,548 | 5/1972 | Brack et al. | 117/212 |
| 3,707,765 | 1/1973 | Coleman | 29/578 |
| 3,840,888 | 10/1974 | Gaensslen et al. | 257/403 |
| 4,128,439 | 12/1978 | Jambotkar | 148/1.5 |
| 4,197,143 | 4/1980 | Berry | 148/1.5 |
| 4,317,686 | 3/1982 | Anand et al. | 148/1.5 |
| 4,663,827 | 5/1987 | Nakahara | 29/571 |
| 4,741,964 | 5/1988 | Aaller | 257/347 |
| 4,897,368 | 1/1990 | Kobushi et al. | 257/413 |
| 5,001,540 | 3/1991 | Ishihara | 357/23.4 |
| 5,006,913 | 4/1991 | Sugahara et al. | 357/23.4 |
| 5,021,846 | 6/1991 | Ueno | 357/23.4 |
| 5,036,370 | 7/1991 | Miyago et al. | 357/23.15 |
| 5,045,905 | 9/1991 | Motai et al. | 257/352 |
| 5,057,889 | 10/1991 | Yamada et al. | 257/77 |

FOREIGN PATENT DOCUMENTS

| | | | |
|---|---|---|---|
| 60-211946 | 10/1985 | Japan | 357/23.15 |
| 63-266428 | 11/1988 | Japan | 357/23.15 |
| 64-64366 | 3/1989 | Japan. | |
| 2090061 | 6/1982 | United Kingdom | 357/23.15 |

OTHER PUBLICATIONS

Ayub Fathimulla et al "Reactively rf magnetron sputtered A/N films as gate dielectric" *J. Appl. Phys* 54(8) Aug. 1983 pp. 4586–4589.

Paul et al "Characterization of pulsed laser deposited boron nitride thin films on InP" *Appl. Phys. Lett* 56(26) June. 25 1990 pp. 2648–2650.

Koch et al "Quantum interference devices made from superconducting oxide Thin films" *Appl. Phys. Lett.* vol. 51 No. 3 Jul. 20, 1987 pp. 200–202.

*Primary Examiner*—Mahshid D. Saadat
*Assistant Examiner*—Courtney A. Bowers
*Attorney, Agent, or Firm*—Harvey Fendelman; Michael A. Kagan

[57] ABSTRACT

A buried, gate insulator field effect transistor is disclosed. It comprises a source, drain, substrate, gate, and a gate insulator layer separating the gate from the source, drain and substrate; and a protective silicon dioxide covering layer. Windows are excised into this covering layer to allow electrical connection to the source, substrate, drain, and gate. The substrate and gate are vertically aligned in the resulting structure. The source, drain and gate are fabricated from a doped, semiconductor of one polarity while the substrate is fabricated from doped semiconductor of the opposite polarity. The gate insulator layer is fabricated by implanting an element or elements selected from Group V, VI or VII into the semiconductor to form a semiconductor-compound insulator. Methods of fabricating this device are also disclosed. In one embodiment the device is fabricated on top of an insulating support. The gate is formed next to the base. In a second embodiment, no base is used. The gate insulator is formed between the gate and substrate. In both cases the gate insulator is formed within the semiconductor in a buried and protected mode.

10 Claims, 6 Drawing Sheets

ION IMPLANTATION BURIED GATE INSULATOR FIELD EFFECT TRANSISTOR

STATEMENT OF GOVERNMENT INTEREST

The invention described herein may be manufactured and used by or for the Government of the United States of America for governmental purposes without the payment of royalties thereon or therefor.

BACKGROUND OF THE INVENTION

The present invention relates to the field of semiconductor devices. More specifically, it relates to fabrication of buried gate insulator field effect transistors.

Most insulated gate field effect transistors in use today are fabricated of silicon. This is because silicon dioxide, which acts very effectively as the gate insulator, offers a well behaved transition from the silicon semiconductor and is physically and chemically stable throughout the series of processing steps necessary to fabricate the transistor. When used as a gate insulator, silicon dioxide is formed by the thermal oxidation technique. Silicon dioxide gate insulators formed by all other techniques have not proved to be as useful as those grown thermally, and as a result their use has been abandoned.

Other semiconductor materials offer attractive properties for use in field effect transistors. Their oxides and other dielectric compounds could act as gate insulators and also offer similar well behaved transitions. However, their use as field effect transistors has been restricted because their oxides and other dielectric compounds could not be thermally grown in a similar manner as silicon dioxide. This was primarily due to the fact that these dielectric materials could not be formed and retained in a physical or chemically stable manner throughout the series of steps necessary in transistor fabrication.

The elemental semiconductor germanium, for example, has an electron mobility of 3900 cm2/Vsec, more than double that of silicon. Its use could enable fabrication of devices with significantly higher processing speed. Other semiconductor materials that could be used are from the Group consisting of carbon, silicon carbide, and compound semiconductors of Group III and V elements, Group II and IV elements, Group II and VI elements, Group IV and VI elements, Group II and V elements, Group V and VI elements, Group V and VIII elements, or Group III and VI elements. If a way could be found to form solid phase gate dielectrics from these semiconductors, and provide protection to these novel dielectric compounds during the fabrication of the transistor it would satisfy a long-felt-need in the field of microelectronic device fabrication.

SUMMARY OF THE INVENTION

The present invention is a buried gate insulator field effect transistor. It comprises a source, drain, substrate, and gate structures with the buried gate insulator layer separating the gate from the source, drain and substrate; and a protective dielectric layer such as silicon dioxide, silicon nitride, silicon oxynitride, or in combination as a covering layer. Windows are excised into this covering layer to allow electrical connection to the source, drain, gate and substrate. The substrate and gate are vertically aligned in the resulting structure.

The source and drain are fabricated from a doped, semiconductor of one polarity while the substrate is fabricated from doped semiconductor of the opposite polarity and the gate fabricated from doped semiconductor of either polarity. The gate insulator is formed by selectively implanting an element or elements into the semiconductor to forth a buried semiconductor-compound gate dielectric layer, and is maintained in this buried configuration during processing and into the final fabricated product. The element is chosen from an appropriate elemental group so as to form a semiconductor-compound that is electrically insulating, and maintains its solid phase and integrity during the processing procedure necessary to fabricate the field effect transistor.

The same semiconductor material is used for the source, drain, gate, substrate, and is a chemical constituent of the gate insulator compound. This semiconductor can be from the Group consisting of carbon, germanium, silicon carbide, and compound semiconductors of Group III and V elements, Group II and IV elements, Group II and VI elements, Group IV and VI elements, Group II and V elements, Group V and VI elements, Group V and VIII elements, or Group III and VI elements.

Methods of fabricating this device are also disclosed. In one embodiment the device is fabricated in a heteroepitaxial grown, single crystal semiconducting film on top of an electrically insulating support. The support can be, for example, sapphire, spinel or magnesium oxide. In an another embodiment only the single crystal semiconductor is present and no support is used. The gate insulator is formed to be positioned between the gate and the semiconductor substrate. In both cases the gate dielectric is formed and maintained in a buried structural configuration.

An appreciation of other aims and objectives of the present invention and a more complete and comprehensive understanding of this invention may be achieved by studying the following description of the embodiments and by referring to the accompanying drawings.

DETAILED DESCRIPTION OF THE PREFERRED EMBODIMENT

FIG. 1 shows the successive stages in the fabrication of one embodiment. First, as shown in FIG. 1A, a p type, single crystal, semiconducting layer 10 is deposited on top of an electrically insulating, single crystal support 12 by well-known epitaxial techniques.

The layer 10 can be an elemental semiconductor, such as germanium. The electrically insulating support 12 can be sapphire, spinel or magnesium oxide.

Figure 1A:
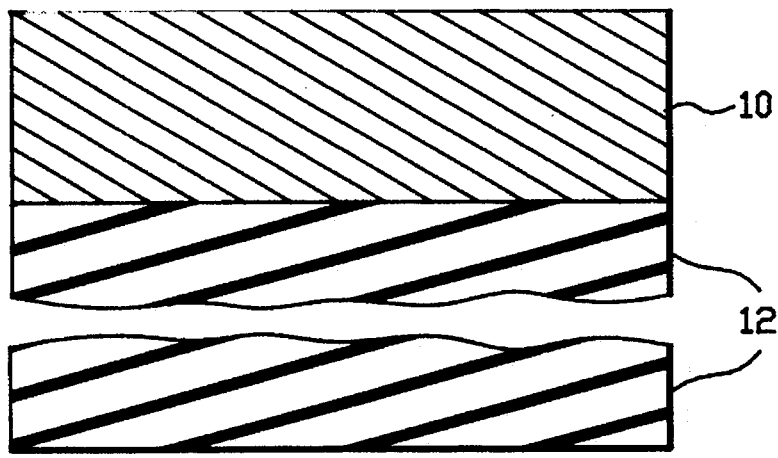
FIGS. 1A, 1B, 1C, 1D, 1E, 1F, 1G, 1H, and 1I show the successive stages in fabrication of the preferred embodiment of this invention.
Figure 1B:
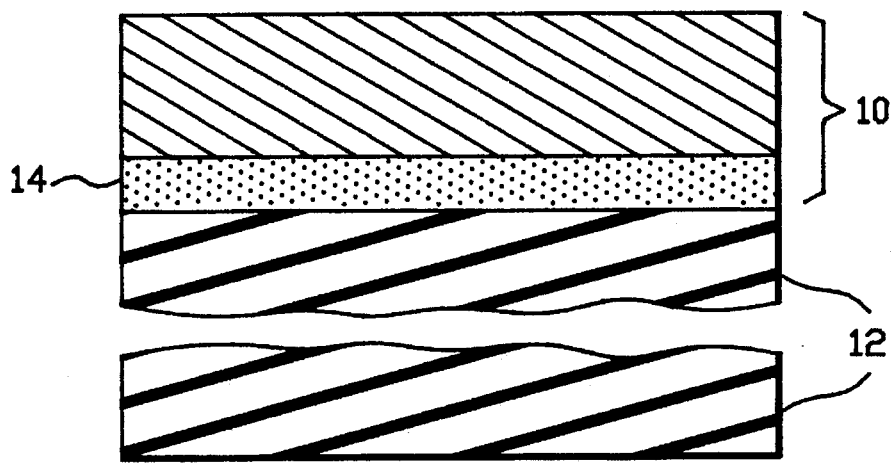
Figure 1C:
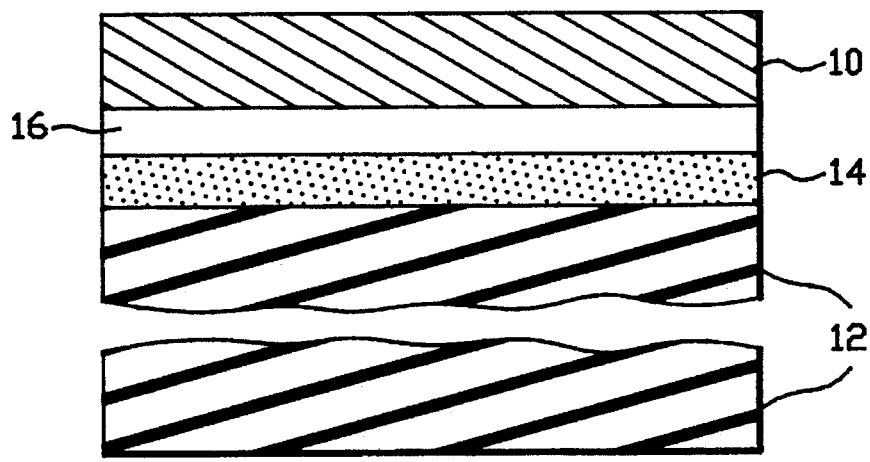

As shown in FIG. 1B, a p-type impurity from Group V is implanted at the bottom of the semiconducting layer 10 to form a $p^+$ buried layer 14. Next, an element or elements from group VI or VII is implanted with sufficient energy and dosage to form a semiconductor compound, electrical insulator layer 16 as shown in FIG. 1C. For example, if the insulator is to be an oxide compound form of the semiconductor, oxygen is used. It is implanted, while the structure is maintained at 400° C., with sufficient energy and dose to form the germanium dioxide layer.

Figure 1D:
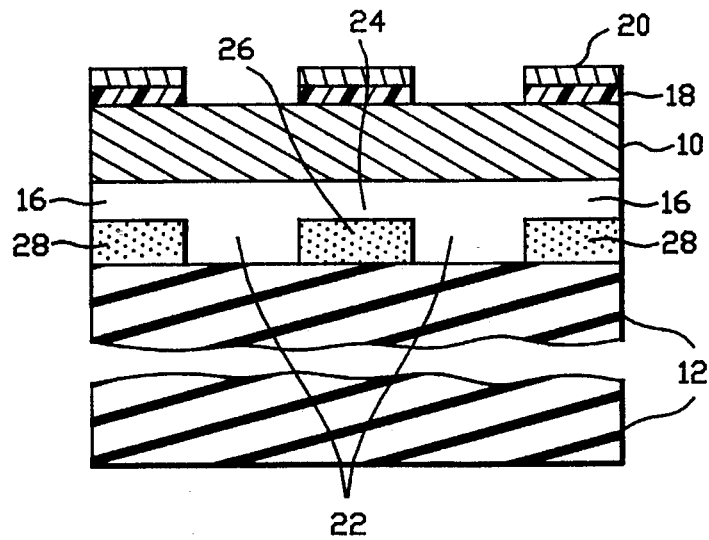

Silicon dioxide 18 and silicon nitride 20 layers are sequentially deposited by chemical vapor deposition techniques on top of the semiconducting layer 10. Photoresist techniques are then used to define patterns in the silicon dioxide 18 and silicon nitride 20 films as shown in FIG. 1D. An element from Group V, VI or VII is implanted with sufficient energy and dosage to form a second semiconductor-compound insulating layer 22. For example, oxygen is implanted while the structure is maintained at 400° C. The patterned silicon dioxide 18 and silicon nitride layers 20 act as masks so that only regions 22 of the $p^+$ buried layer 14 are converted to insulator. A portion of the semiconductor-compound insulator layer 16 now functions as the gate dielectric and is noted as region 24. This second semiconductor-compound insulator regions 22 segments the $p^+$ buried layer into the gate 26, located in the center and interfaced with the gate dielectric 24, and two $p^+$ buried bars 28 as shown in FIG. 1D. The $p^+$ buried bars 28 are electrically isolated conductors and are available for use as interconnects in integrated circuits.

Following this oxygen implant, a thermal anneal is performed on the structure to assist in completion of the formation of the semiconductor-compound insulator, germanium dioxide, in this example, and to sharpen the boundary between said insulator region and the semiconductor, germanium, in this example.

Figure 1E:
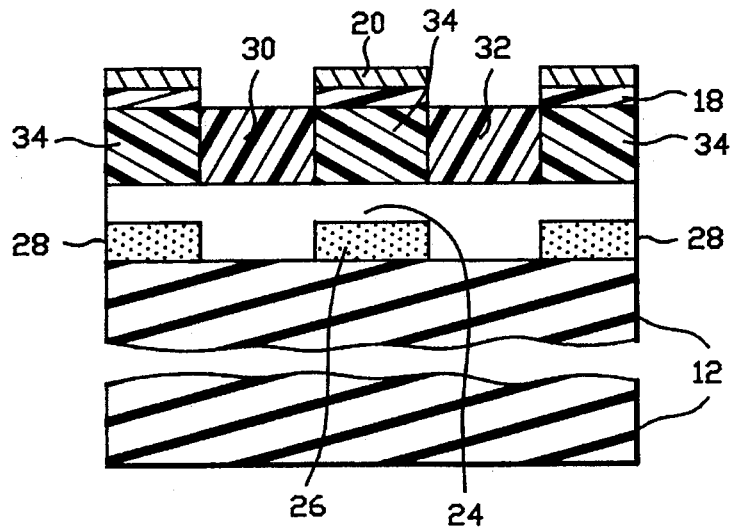
Figure 1F:
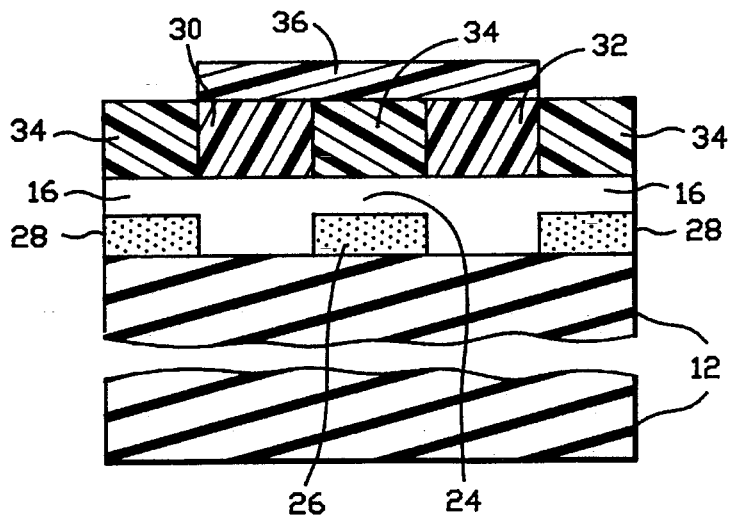

The silicon dioxide 18 and silicon nitride layers 20 are used as patterns once again for implanting n-type dopants to form source 30 and drain 32 regions, as shown in FIG. 1E. The remaining semiconductor forms the substrate region 34.

Figure 1G:
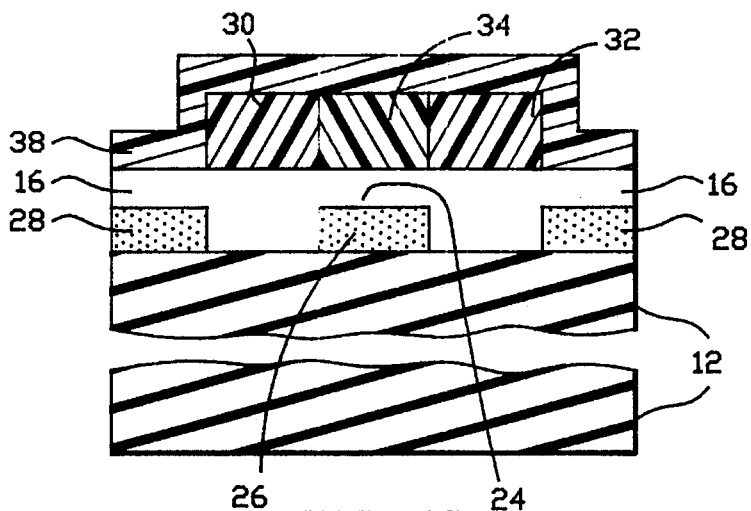

Silicon dioxide layer 18 and silicon nitride layer 20 are now removed. Silicon dioxide 36 is once again chemically vapor deposited and photolithographically defined to form the pattern shown in FIG. 1F. This pattern covers most of the source and drain surfaces, and will act to delineate the active single crystal region of the field effect transistor. Dry etching then removes all unprotected single crystal semiconductor regions such as region 34 down to the first formed semiconductor-compound insulator layer 16. A final, protective layer of chemically deposited silicon dioxide 38 is then deposited on the top and side surfaces of the semiconductor as shown in FIG. 1G. To minimize any interaction with the semiconductor-compound insulator layer 16, the dry etching and deposition of the protective layer could be performed sequentially and in situ.

Figure 1H:
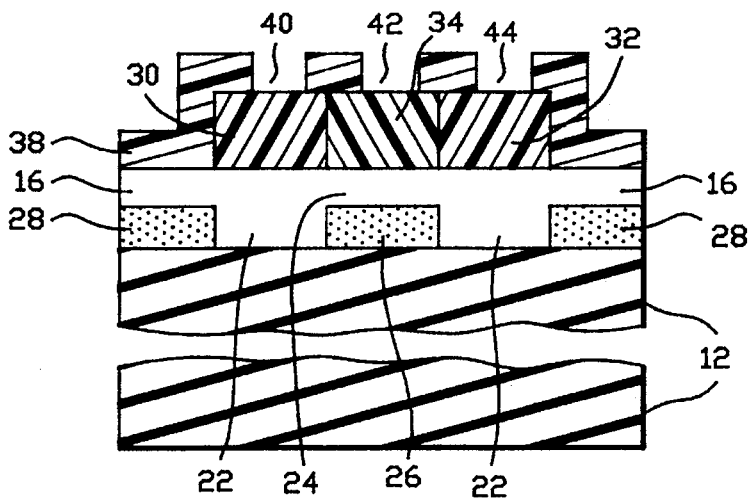
Figure 1I:
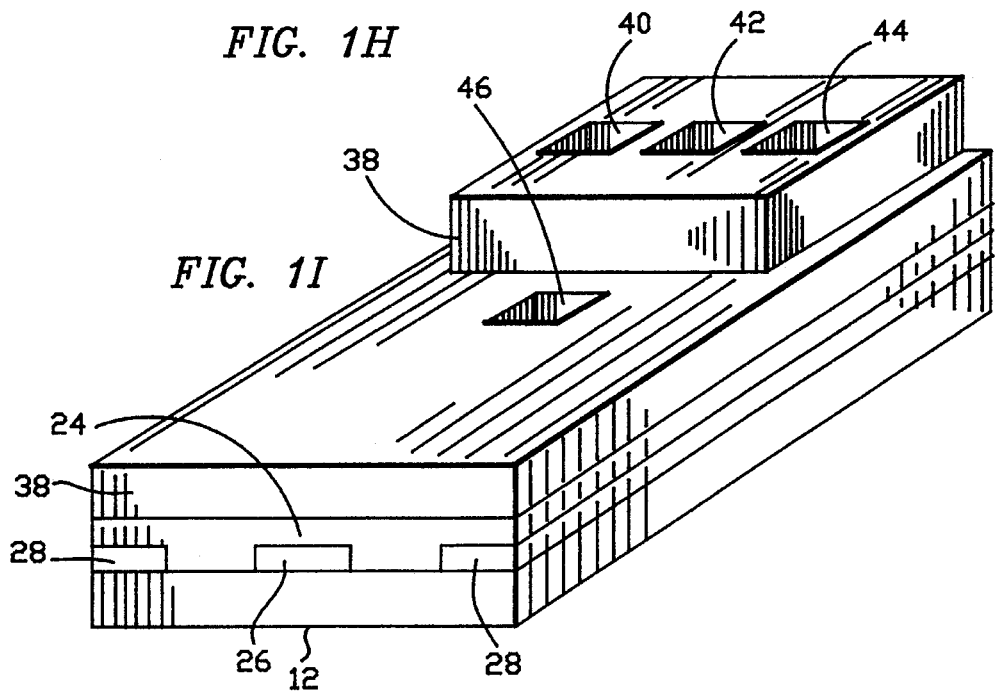

Finally, as shown in FIGS. 1H and 1I, windows 40, 42, and 44 are excised in the protective layer 38 to allow contact to be made to the source 30, drain 32 and substrate 34. An additional window 46 is placed through protective layer 38 as well as through gate insulator 24 to allow contact to be made to gate 26. Window 46 is located out of the plane of the paper. This is readily seen in FIG. 1I which is a perspective view of the final structure.

Figure 2A:
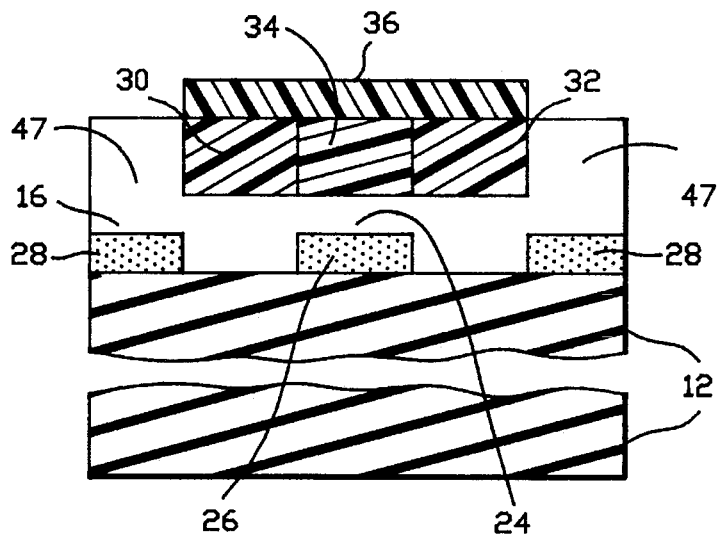
FIGS. 2A, 2B, and 2C show in successive steps a minor modification that can be made in the latter stages of fabrication of the preferred embodiment.

Instead of etching away portions of the unprotected semiconductor substrate 34, as shown in FIG. 1G, these semiconductor regions could be converted by ion implantation to an insulator 47 that is a chemical compound 47 of the semiconductor. That is, they could be converted to a semiconductor-compound insulator. This will increase the thickness of the insulator layer by the addition of layer 47 above the first formed semiconductor-compound insulator layer 16. This alternative is shown in FIG. 2A. Then the final, protective layer of chemically deposited silicon dioxide 38 is deposited on the top surface of the semiconductor. To minimize any interaction with the semiconductor-compound insulator layer 47, the dry etching and deposition of the protective layer could be performed sequentially and in situ.

Figure 2B:
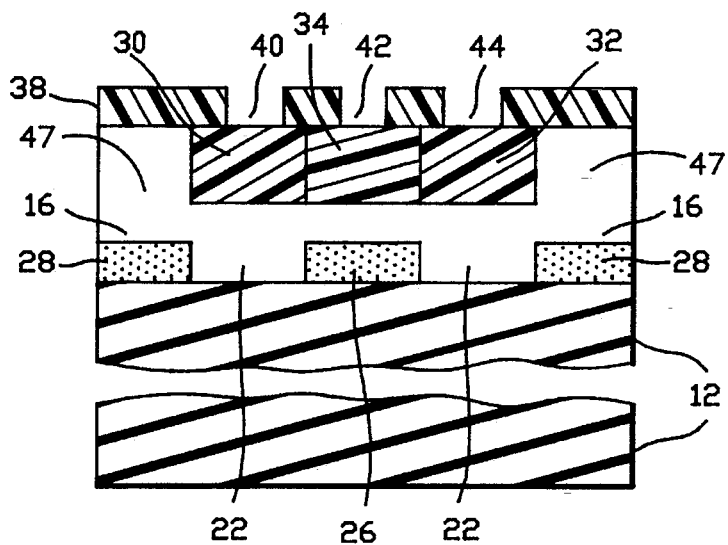
Figure 2C:
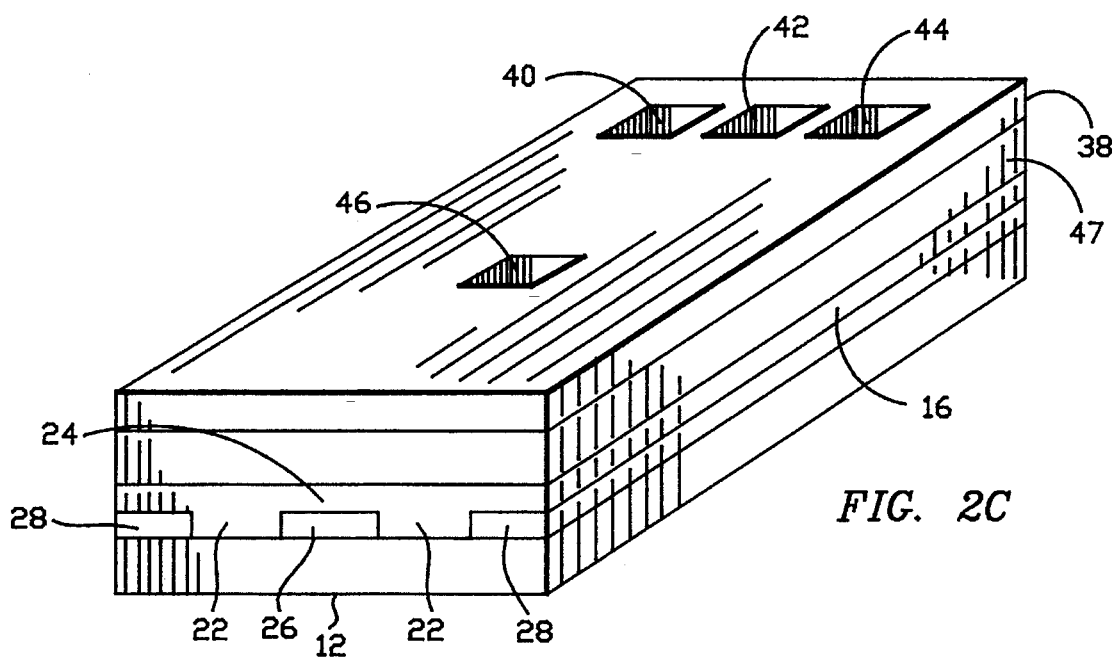

Finally, as shown in FIGS. 2B and 2C, windows 40, 42, and 44 are excised in the protective layer 38 to allow contact to be made to the source 30, substrate 34, and drain 32. Window 46 is excised in protective layer 38 and in the compound dielectric insulator layer, which is comprised of insulator layer 47 and gate insulator layer 24, to make contact to the gate 26. Window 46 is located out of the plane of the paper. This is readily seen in FIG. 2C which is a perspective view of the modified final structure.

In another embodiment of this invention, the gate insulator 24 may first be formed as a buried insulator; but 14 with the use of subsequent processing can be placed, with the gate electrode 26, above the substrate 34. FIG. 3 shows accomplishing this by additive processing.

Figure 3A:
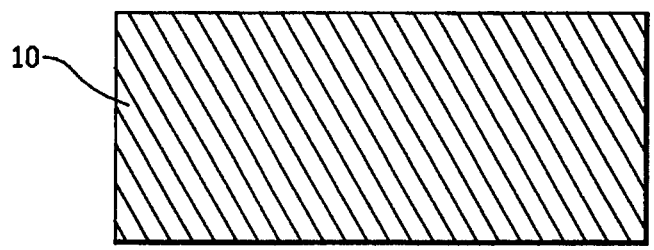
FIGS. 3A, 3B, 3C, 3D, 3E, 3F, and 3G show the successive stages in fabrication of an alternate embodiment of this invention utilizing fabrication by additive processing.

FIG. 3A shows starting with a p type, single crystal semiconductor layer 10. This layer should be sufficiently thick so as to provide support during processing. Layer 10 can be the elemental semiconductor, germanium.

Figure 3B:
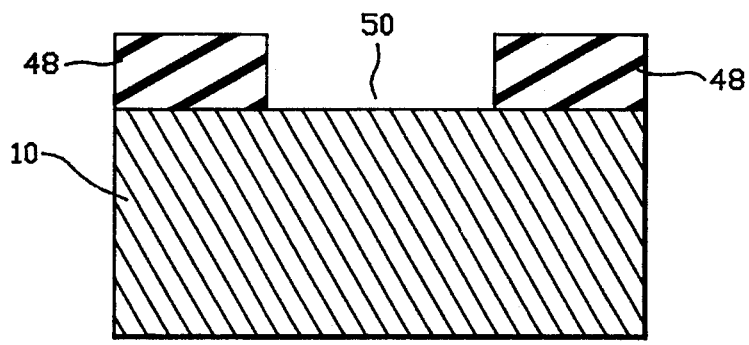
Figure 3C:
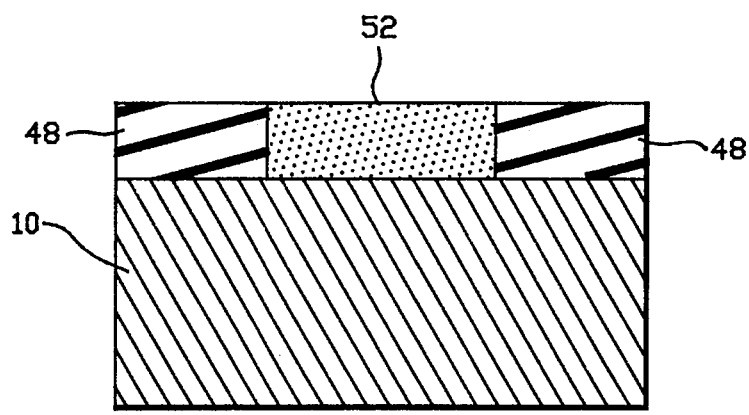

A barrier material 48 such as silicon dioxide is chemically vapor deposited. Photolithographic and etching techniques are then employed to form a window 50 in the center of the barrier 48 as shown in FIG. 3B. The remainder of the barrier 48 becomes a mask. As illustrated in FIG. 3C, a $p^+$ doped layer of germanium 52 is deposited by well known epitaxial techniques onto layer 10 through the window 50. This p doped structure will become in part gate 26.

To form a semiconductor-compound insulator an element or elements may be selected from groups V, VI, or VII. The appropriate selection is determined by the requirement that the resulting semiconductor-compound is an electrical insulator and maintains its solid phase during the processing procedure necessary to fabricate the field effect transistor.

Figure 3D:
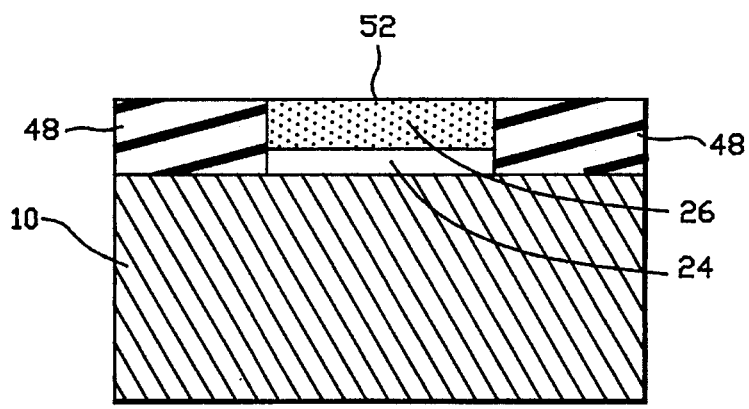

If the gate insulator is to be an oxide compound of germanium and oxygen, an element from group VI, is selected. While the germanium semiconductor is maintained at 400° C., oxygen is implanted within gate 26 to form the gate insulator 24. It is implanted at sufficient energy and dosage to form germanium dioxide at the gate 26-semiconductor 10 interface. Following this oxygen implant, a thermal anneal is performed on the structure to assist in completion of the formation of the semiconductor-compound insulator, germanium dioxide, and to sharpen the boundary between said insulator region and the semiconductor, germanium. This is illustrated in FIG. 3D. Note that barrier 48 prevents implantation of the selected element at all other areas.

Figure 3E:
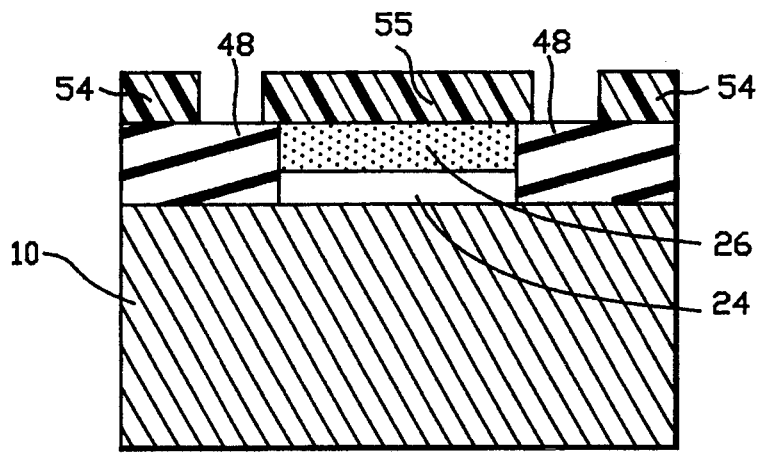

A resist 54 is applied and photolithographic techniques are used to define window 55 about the gate region as shown in FIG. 3E.

Figure 3F:
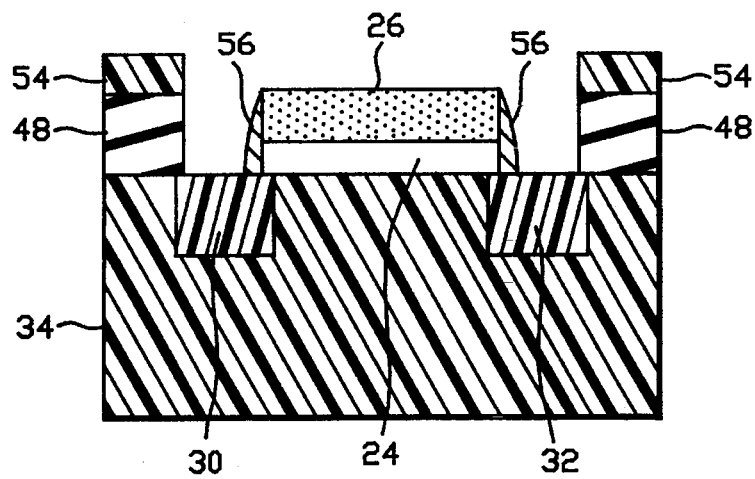

The barrier material 48 is anisotropically etched, such as in a plasma etcher, leaving barrier sidewall structures 56 against gate 26 and gate insulator 24. The exposed semiconductor is then implanted and diffused partially under the gate insulator 24-gate 26 structure, and partially under barrier material 48. The implant is an n type dopant and forms the source 30 and drain 32 regions, and the remaining p doped germanium semiconductor becomes the substrate 34 as shown in FIG. 3F.

Figure 3G:
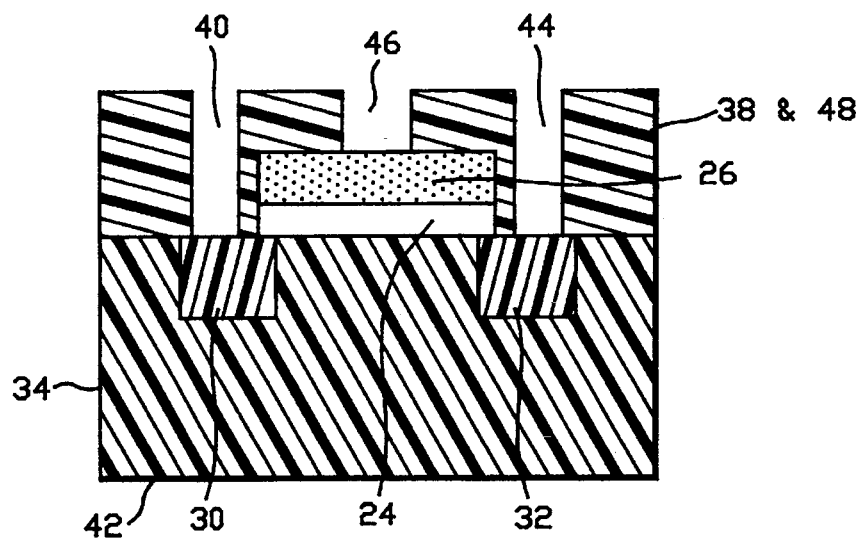

Then, as shown in FIG. 3G, a protective layer of silicon dioxide 38 is chemically vapor deposited. The final protective layer is now comprised of coating 38 and layer 48. Finally, windows 40, 44, and 46 are excised in coating 38 and layer 48 to allow contact to be made to the source 30, drain 32, and gate 26. The lower surface of the substrate 34 effectively becomes the substrate window 42.

As a result of this invention semiconductor materials other than silicon can now be used for field effect transistor fabrication.

The present invention has been described in detail with reference to the particular embodiments. While this invention has been described with reference to specific p and n dopings, it should be obvious to those skilled in the art that p and n doping could be interchanged without affecting operation of this invention. Persons possessing ordinary skill in the art to which this invention pertains will appreciate that other modifications and enhancements may be made without departing from the spirit and scope of the claims that follow.

What is claimed is:

1. A buried gate insulator field effect semiconductor transistor comprising:
   a source comprised of a semiconductor material;
   a substrate comprised of said semiconductor material, said substrate being adjacent to said source;
   a drain comprised of said semiconductor material, said drain being adjacent to said substrate;
   an ion implanted gate dielectric insulator comprised of a compound of said semiconductor material; said gate insulator being adjacent to said source, said drain and said substrate; said gate insulator being solid and able to withstand processing conditions;
   a gate comprised of said semiconductor material, said gate being adjacent to said gate dielectric insulator, said gate dielectric insulator electrically insulating said source, said drain and said substrate from said gate;
   a protective layer; said protective layer covering said source, said drain, said substrate and said gate; said protective layer having windows for electrical connection to said source, said drain, said substrate and said gate;
   said substrate and said gate being vertically aligned; and
   said semiconductor material being selected from the Group consisting of carbon, germanium, silicon carbide, and the non-silicon compound semiconductors.

2. The transistor as claimed in claim 1, in which:
   said source is doped germanium;
   said drain is doped germanium;
   said substrate is doped germanium;
   said gate is doped germanium;
   said gate insulator is germanium implanted with oxygen; and
   said protective layer is silicon dioxide.

3. The transistor as claimed in claim 1, further comprising:
   an insulative support layer in contact with said gate for electrical insulation, said insulative support layer being selected from the group consisting of sapphire, spinel and magnesium oxide.

4. A buried gate insulator field effect semiconductor transistor comprising:
   a first layer including:
      a source region comprised of a semiconductor material;
      a substrate region comprised of said semiconductor material adjacent to said source region;
      a drain region comprised of said semiconductor material adjacent to said substrate region;
   an ion implanted gate dielectric insulator layer comprised of a compound of said semiconductor material adjacent to said first layer;
   a gate layer comprised of said semiconductor material adjacent to said gate insulator layer; and
   a protective layer adjacent to said source region, said drain region, said gate dielectric insulator layer and said substrate region, said protective layer having windows for electrical connection to said source region, said drain region, said gate layer and said substrate region;
   said substrate region and said gate layer being vertically aligned; and
   said semiconductor being selected from the Group consisting of carbon, germanium, silicon carbide, and the non-silicon compound semiconductors.

5. The transistor as claimed in claim 4, in which:
   said source region is doped germanium;
   said drain region is doped germanium;
   said substrate region is doped germanium;
   said gate layer is doped germanium;
   said gate insulator layer is germanium implanted with oxygen; and
   said protective layer is silicon dioxide.

6. The transistor as claimed in claim 4, further comprising:
   an insulative support layer, in contact with said gate, for electrical insulation, said insulative support layer being selected from the group consisting of sapphire, spinel and magnesium oxide.

7. The transistor as claimed in claim 1 wherein:
   said gate insulator is encapsulated by material that is not the same as said compound of said semiconductor material.

8. The transistor as claimed in claim 7 wherein:
   said encapsulating material includes a barrier sidewall structure that extends between said source and drain and said gate.

9. The transistor of claim 1 wherein:
   said semiconductor material comprises single crystal material.

10. The transistor of claim 4 wherein:
    said semiconductor material comprises single crystal material.

* * * * *